US010476489B2

(12) United States Patent
Kumahara et al.

(10) Patent No.: US 10,476,489 B2
(45) Date of Patent: Nov. 12, 2019

(54) SIGNAL TRANSMISSION CIRCUIT

(71) Applicant: Panasonic Intellectual Property Management Co., Ltd., Osaka (JP)

(72) Inventors: Minoru Kumahara, Osaka (JP); Richard Visee, The Hague (NL); Gerrit Van Der Horn, Delft (NL); Ronny Van Rooij, Roermond (NL); Pooyan Sakian Dezfuli, Nuenen (NL)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/580,443

(22) PCT Filed: Jul. 8, 2016

(86) PCT No.: PCT/JP2016/003242
§ 371 (c)(1),
(2) Date: Dec. 7, 2017

(87) PCT Pub. No.: WO2017/029774
PCT Pub. Date: Feb. 23, 2017

(65) Prior Publication Data
US 2018/0167060 A1   Jun. 14, 2018

(30) Foreign Application Priority Data

Aug. 18, 2015   (JP) .................. 2015-161359

(51) Int. Cl.
*H03B 1/00*   (2006.01)
*H03K 3/00*   (2006.01)
(Continued)

(52) U.S. Cl.
CPC .............. *H03K 5/125* (2013.01); *H03F 3/45* (2013.01); *H03K 17/165* (2013.01);
(Continued)

(58) Field of Classification Search
CPC ........... H03K 3/57; H03K 3/537; H03K 3/55; H03K 3/53; G01S 7/282
(Continued)

(56) References Cited

U.S. PATENT DOCUMENTS 9,647,571 B2 *   5/2017   Orr .................... H02M 7/4807
2008/0068062 A1 *  3/2008  Thalheim ........... H03K 19/0175
                                                                327/307
(Continued)

FOREIGN PATENT DOCUMENTS

DE   102007033228 A1   1/2008
JP   2007-036497   2/2007
(Continued)

OTHER PUBLICATIONS

The Extended European Search Report dated Jul. 17, 2018 for the related European Patent Application No. 16836774.6.
(Continued)

*Primary Examiner* — Anh Q Tra
(74) *Attorney, Agent, or Firm* — McDermott Will & Emery LLP

(57) ABSTRACT

A signal transmission circuit includes a primary element configured to receive differential signals which are generated from a transmission signal and contain alternating-current (AC) components, a secondary element magnetically or capacitively coupled with the primary element and configured to output AC signals containing the AC components of the differential signals, a secondary circuit including a pair of transmission lines configured to propagate the AC signals. The secondary circuit is electrically connected to the secondary element and extracts the transmission signal from the AC signals. The feedback circuit feedbacks an intermediate voltage between voltages of the pair of transmission lines such that the intermediate voltage is converged to a (Continued)

reference voltage. This signal transmission circuit prevents the secondary circuit from malfunctioning due to noise.

10 Claims, 10 Drawing Sheets

(51) Int. Cl.
H03K 5/125 (2006.01)
H03K 17/691 (2006.01)
H03K 19/0175 (2006.01)
H04B 5/02 (2006.01)
H03F 3/45 (2006.01)
H03K 17/16 (2006.01)
H04B 1/18 (2006.01)

(52) U.S. Cl.
CPC ....... H03K 17/691 (2013.01); H03K 19/0175 (2013.01); H04B 1/18 (2013.01); H04B 5/02 (2013.01)

(58) Field of Classification Search
USPC ........................................................ 327/108
See application file for complete search history.

(56) References Cited

U.S. PATENT DOCUMENTS

| 2009/0091413 | A1* | 4/2009 | Kato | H03K 17/08142 336/105 |
| 2010/0020448 | A1 | 1/2010 | Ng et al. | |
| 2013/0064326 | A1* | 3/2013 | Chen | H04L 25/0276 375/316 |
| 2014/0085951 | A1* | 3/2014 | Kaeriyama | H04B 3/50 363/126 |
| 2016/0056850 | A1* | 2/2016 | Nagase | H03K 5/04 375/340 |

FOREIGN PATENT DOCUMENTS

| JP | 2009-094576 | 4/2009 |
| JP | 2015-008423 | 1/2015 |

OTHER PUBLICATIONS

International Search Report of PCT application No. PCT/JP2016/003242 dated Sep. 27, 2016.

* cited by examiner

SIGNAL TRANSMISSION CIRCUIT

This application is a U.S. national stage of the PCT international application No. PCT/JP2016/003242 filed on Jul. 8, 2016, which claims the benefit of foreign priority of Japanese patent application No. 2015-161359 filed on Aug. 18, 2015, the contents all of which are incorporated herein by reference.

TECHNICAL FIELD

The present invention relates to a signal transmission circuit, particularly to a signal transmission circuit including a primary circuit and a secondary circuit magnetically or capacitively coupled with the primary circuit.

BACKGROUND ART

A wireless communication system (a signal transmission circuit) transmits signals from a primary circuit to a secondary circuit using magnetic coupling. Such a wireless communication system is disclosed in PTL 1 which includes a transmitter and a receiver.

The transmitter includes a transmission circuit (a primary circuit) which receives transmitted data, and a transmitting coil functioning as a transmitting antenna. The transmission circuit supplies a current which corresponds to the transmitting data to the transmitting coil so that the transmitting coil can induce a magnetic-field change corresponding to the transmitting data.

The receiver includes a receiving coil functioning as a receiving antenna, and a reception circuit (a secondary circuit). The receiving coil is inductively coupled with the transmitting coil, and detects the magnetic-field change induced by the transmitting coil. The reception circuit generates receiving data based on an induced electromotive force generated at both ends of the receiving coil.

CITATION LIST

Patent Literature

PTL 1: Japanese Patent Laid-Open Publication No. 2007-036497

SUMMARY

A signal transmission circuit includes a primary element configured to receive differential signals which are generated from a transmission signal and which contain alternating-current (AC) components, a secondary element magnetically or capacitively coupled with the primary element and configured to output AC signals containing the AC components of the differential signals, a secondary circuit including a pair of transmission lines that propagate the AC signals, the secondary circuit being electrically connected to the secondary element and extracting the transmission signal from the AC signals, a feedback circuit configured to feedback an intermediate voltage between voltages of the pair of transmission lines such that the intermediate voltage is converged to a reference voltage. This signal transmission circuit prevents the secondary circuit from malfunctioning due to noises.

DETAIL DESCRIPTION OF EXEMPLARY EMBODIMENT

Figure 1:
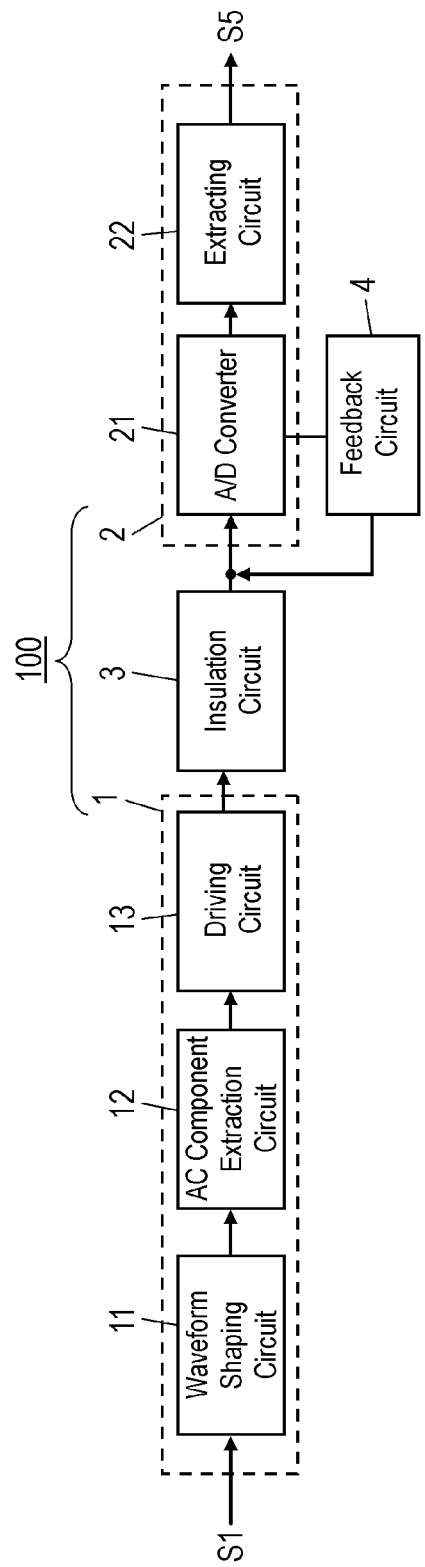
FIG. 1 is a schematic block diagram of a signal transmission circuit according to an exemplary embodiment.
Figure 2:
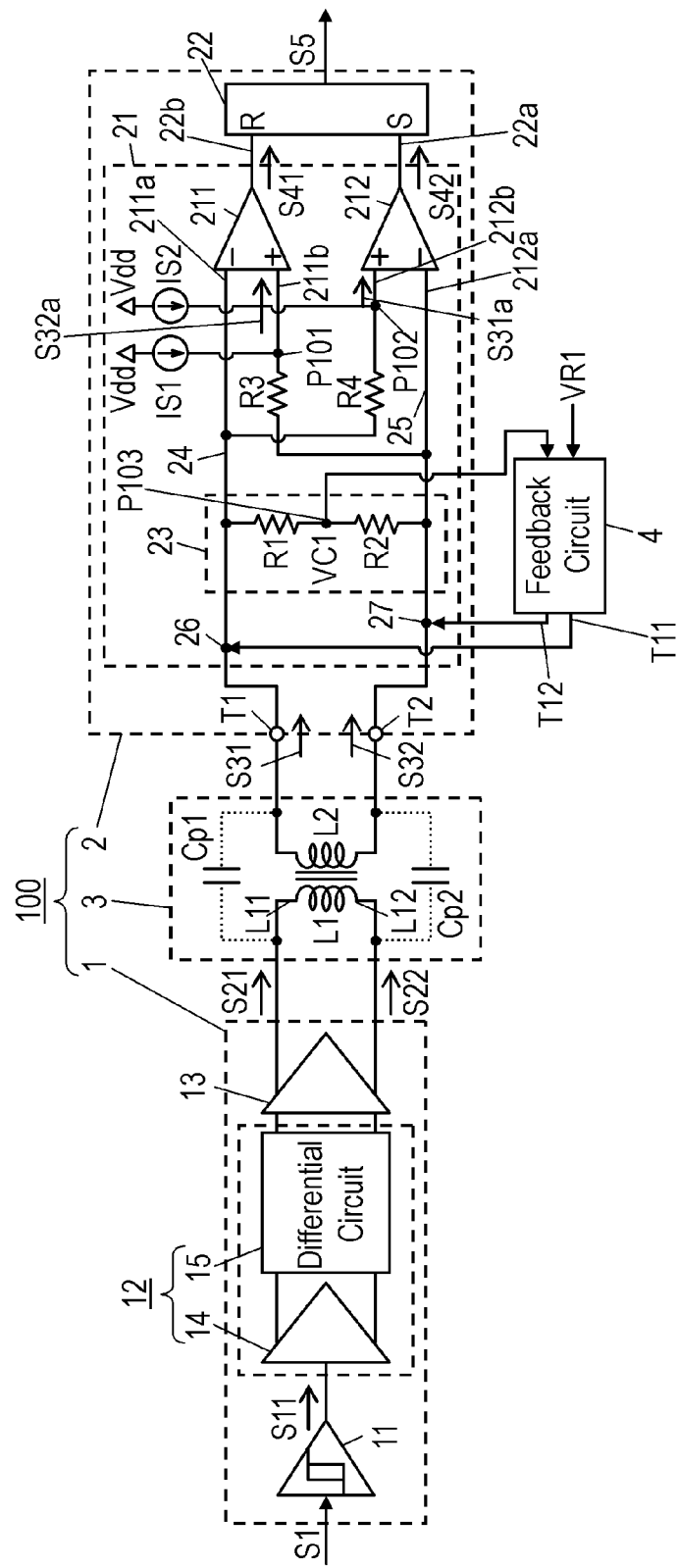
FIG. 2 is a schematic circuit diagram of the signal transmission circuit according to the embodiment.

FIGS. 1 and 2 are a schematic block diagram and a schematic circuit diagram of signal transmission circuit 100 according to an exemplary embodiment, respectively. Signal transmission circuit 100 includes insulation circuit 3, secondary circuit 2, and feedback circuit 4. Insulation circuit 3 includes a transformer including primary coil L1 as a primary element and secondary coil L2 as a secondary element. Primary coil L1 receives differential signals S21 and S22 which are generated from a transmission signal S1.

Secondary coil L2 is magnetically coupled with primary coil L1, and outputs alternating-current (AC) signals S31 and S32 which contain AC components of the differential signals S21 and S22. Secondary circuit 2 includes a pair of transmission lines 24 and 25 which are electrically connected to secondary coil L2. The AC signals S31 and S32 propagate through transmission lines 24 and 25. Secondary circuit 2 extracts the transmission signal S1 from the AC signals S31 and S32 and outputs extracted transmission signal S1 as an output signal S5.

Feedback circuit 4 feedbacks an intermediate voltage VC1 between voltages of transmission lines 24 and 25 to converge voltage VC1 to a reference voltage VR1.

Signal transmission circuit 100 according to the embodiment will be detailed below. The following embodiment is just an example of the present invention, and the present invention can be variously modified according to design or other requirements within the technical idea of the present invention.

Signal transmission circuit 100 further includes primary circuit 1 electrically connected to primary coil L1 (primary element). Primary circuit 1 generates the differential signals S21 and S22 from the transmission signal S1. The transmission signal S1 is a signal electrically indicating data.

Data in accordance with the present embodiment is serial data. Primary circuit 1 includes waveform shaping circuit 11, AC component extraction circuit 12, and driving circuit 13.

Waveform shaping circuit 11 is implemented by, for example, a Schmitt trigger circuit. Waveform shaping circuit 11 sharply shapes the rising and falling edges of the transmission signal S1 so as to amplify harmonic components of the signal S1. Circuit 11 is not necessarily a Schmitt trigger circuit.

Figure 3:
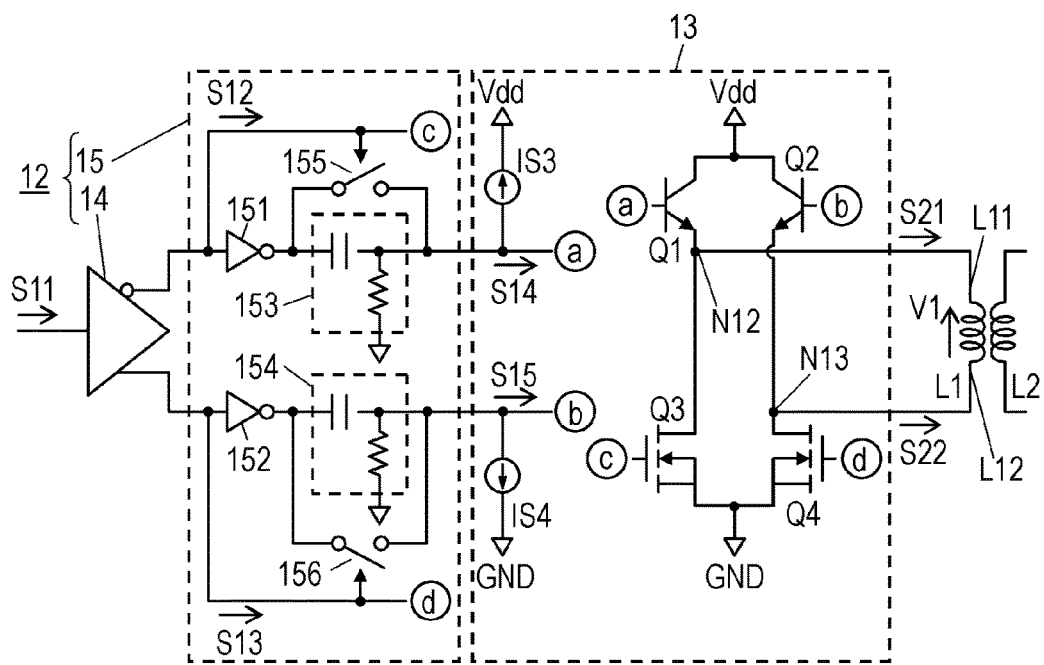
FIG. 3 is a schematic circuit diagram of a primary circuit of the signal transmission circuit according to the embodiment.
Figure 4:
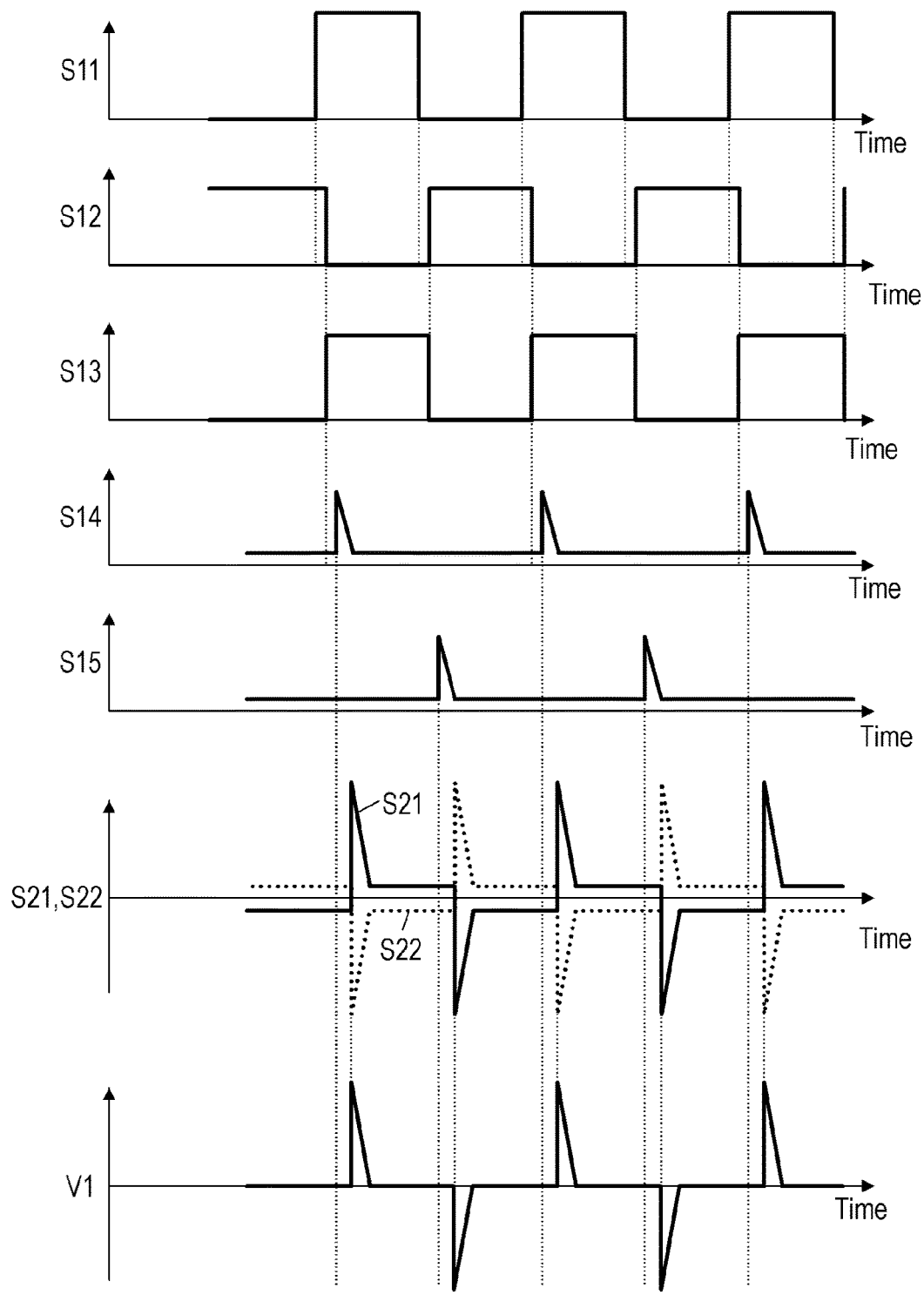
FIG. 4 shows signal waveforms of the primary circuit of the signal transmission circuit according to the embodiment.
Figure 5:
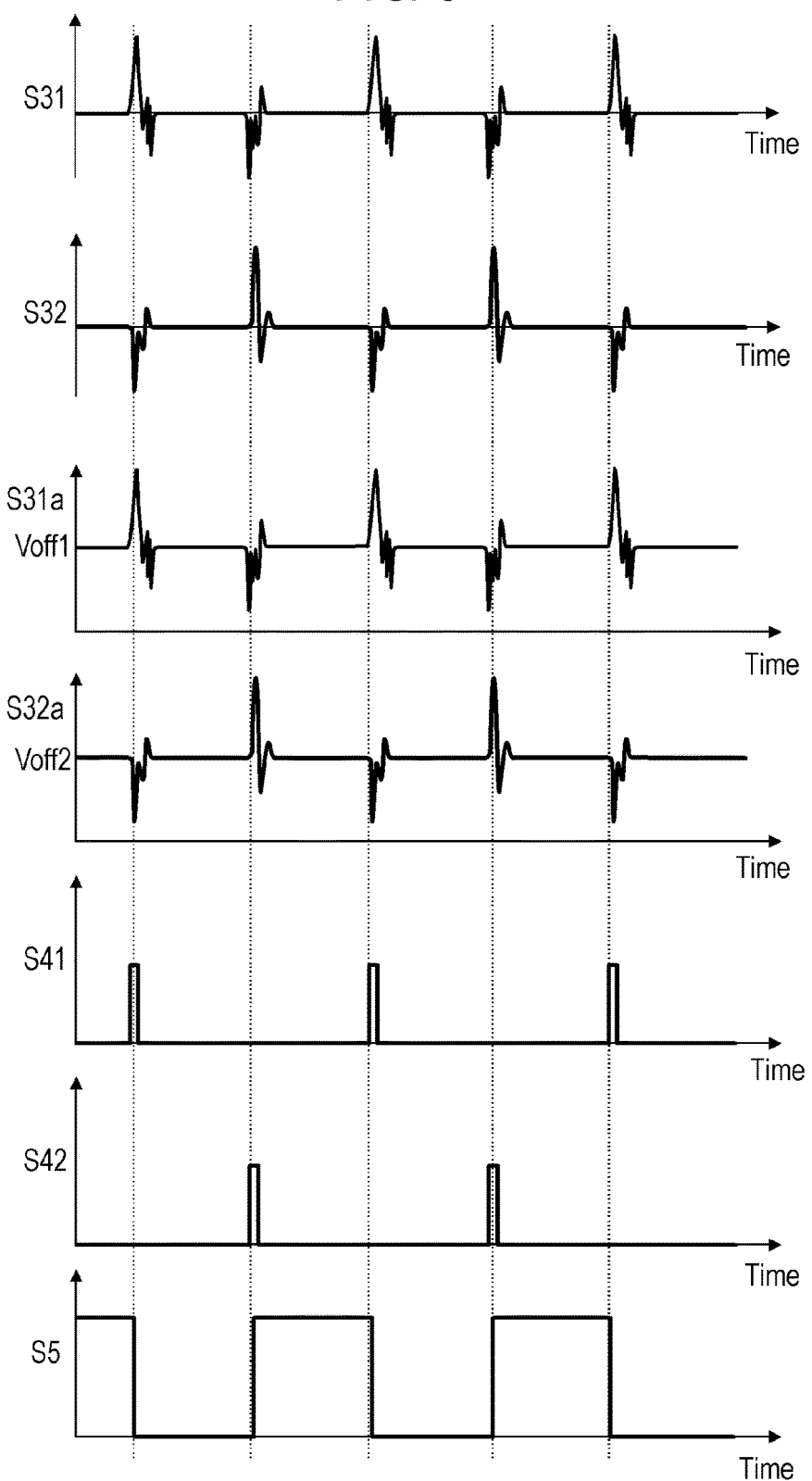
FIG. 5 shows signal waveforms of a secondary circuit of the signal transmission circuit according to the embodiment.

AC component extraction circuit 12 includes signal conversion circuit 14 and differential circuit 15. Circuit 14 is implemented by a differential amplifier. FIG. 3 is a schematic circuit diagram of primary circuit 1. FIG. 4 shows signal waveforms of primary circuit 1. FIG. 5 shows signal waveforms of secondary circuit 2. In FIGS. 4 and 5, the vertical axis represents signal values, and the horizontal axis represents time. Signal conversion circuit 14 converts a single-end signal S11 supplied from waveform shaping circuit 11 into two differential signals S12 and S13, and outputs differential signals S12 and S13, as shown in FIG. 3. The differential signal S13 is slightly delayed in phase with respect to the signal S11 as shown in FIG. 4. The differential signal S12 has a phase inverted to that of the signal S13, as shown in FIG. 4.

As shown in FIG. 3, differential circuit 15 differentiates the differential signals S12 and S13 received from signal conversion circuit 14, extracts the AC components of the signals S12 and S13, and outputs differential signals S14 and S15. Differential circuit 15 includes two inverters 151 and 152, two differentiators 153 and 154, and two switching elements 155 and 156. Inverters 151 and 152 output signals with phases inverted to those of the differential signals S12 and S13. Differentiators 153 and 154 differentiate the signals output from Inverters 151 and 152, respectively, and output the differentiated signals. Differentiators 153 and 154 may be implemented by, for example, an RC circuit including a resistor and a capacitor.

Switching elements 155 and 156 are electrically connected in parallel with differentiators 153 and 154, respectively. Switching elements 155 and 156 are turned on and off in response to the differential signals S12 and S13, respectively. In accordance with the present embodiment, switching element 155 is turned on when the level of signal S12 is high while switching element 155 is turned off when the level of signal S12 is low. Switching element 156 is turned on when the level of signal S13 is high while switching element 156 is turned off when the level of signal S13 is low.

Therefore, the signals supplied from inverters 151 and 152 pass through differentiators 153 and 154 when the levels of differential signals S12 and S13 are high, respectively. The signals supplied from inverters 151 and 152 do not pass through differentiators 153 and 154 when the levels of signals S12 and S13 are low, respectively. Hence, the differential signal S14 is a signal that is obtained by differentiating the rising edge of the signal S11, as shown in FIG. 4. The differential signal S15 is a signal that is obtained by differentiating the falling edge of the signal S11, as shown in FIG. 4. An offset from constant current source IS3 supplying a constant current to power-supply potential point Vdd is added to the differential signal S14. An offset from constant current source IS4 supplying a constant current to a circuit ground GND is added to the differential signal S15.

As shown in FIG. 3, driving circuit 13 generates the differential signals S21 and S22 based on the differential signals S12 to S15 supplied from differential circuit 15. The differential signals S21 and S22 are current signals for driving primary coil L1 of insulation circuit 3. Driving circuit 13 includes four switching elements Q1 to Q4. Switching elements Q1 and Q2 are npn-type bipolar transistors. Elements Q3 and Q4 are enhancement-mode n-channel metal-oxide-semiconductor field-effect transistors (MOSFETs).

The collectors of elements Q1 and Q2 are electrically connected to power-supply potential point Vdd. The base of element Q1 receives the differential signal S14 (the node "a" shown in FIG. 3). The base of element Q2 receives the differential signal S15 (the node "b" shown in FIG. 3). The sources of elements Q3 and Q4 are electrically connected to the circuit ground GND. The gate of element Q3 receives the differential signal S12 (the node "c" shown in FIG. 3). The gate of element Q4 receives the differential signal S13 (the node "d" shown in FIG. 3). The emitter of element Q1 and the drain of element Q3 are connected together at node N12 electrically connected to end L11 of primary coil L1. The emitter of element Q2 and the drain of element Q4 are connected together at node N13 electrically connected to end L12 of primary coil L1.

FIG. 4 shows signal waveforms of primary circuit 1. Driving circuit 13 allows the differential signal S21, a current, to be applied to end L11 of primary coil L1. Driving circuit 13 also allows the differential signal S22, a current, to be applied to end L12 of primary coil L1. The signal S22 is a signal with a phase inverted to that of the signal S21. As a result, an AC voltage V1 shown in FIG. 4 is supplied to primary coil L1.

In other words, driving circuit 13 sends the differential signal S21 to end L11 of primary coil L1. The signal S21 is the signal corresponding to the rising edge of the transmission signal S1. Meanwhile, driving circuit 13 sends the differential signal S22 to end L12 of primary coil L1. The signal S22 is the signal corresponding to the falling edge of the transmission signal S1.

In the case that a rectangular wave corresponding to data is simply applied to the transformer including primary coil L1 and secondary coil L2, the AC component of the signal applied to primary coil L1 is transmitted to secondary coil L2. However, if such a rectangular wave is applied to the transformer, a current is continuously supplied to primary coil L1 and primary circuit 1 since the transformer has a low impedance to DC components. This configuration increases power consumption.

Meanwhile, in signal transmission circuit 100 according to the present embodiment, differential circuit 15 of primary circuit 1 removes a direct-current (DC) component of the signal applied to primary coil L1. This configuration prevents a current from being continuously supplied to primary coil L1 and primary circuit 1, hence preventing power consumption from increasing. Primary circuit 1 does not necessarily include differential circuit 15.

Secondary circuit 2 includes AD converter 21 and extraction circuit 22, as shown in FIGS. 1 and 2. Secondary circuit 2 further includes transmission lines 24 and 25 through which the AC signals S31 and S32 propagate, respectively.

AD converter 21 converts the AC signals S31 and S32, analog signals supplied from secondary coil L2, into digital pulse signals S41 and S42, respectively, and outputs digital pulse signals S41 and S42. AD converter 21 includes comparators 211 and 212 and voltage divider circuit 23.

Comparators 211 and 212 are electrically connected to transmission lines 24 and 25, respectively, and compare the AC signals S31 and S32 that propagate through transmission lines 24 and 25 with each other.

Comparator 211 has inverting input terminal 211a which receives the AC signal S31. Comparator 211 further has non-inverting input terminal 211b which receives a signal S32a which is obtained by adding an offset voltage Voff1 to the AC signal S32. The offset voltage Voff1 (see FIG. 5) is generated by resistor R3 and constant current source IS1. Resistor R3 is electrically connected between transmission line 25 and non-inverting input terminal 211b of comparator 211. Constant current source IS1 is electrically connected between power-supply potential point Vdd and node P101 at which one end of resistor R3 is connected with non-inverting input terminal 211b of comparator 211.

Comparator 211 outputs the pulse signal S41. The level of the pulse signal S41 is high when the signal S32a is larger than the AC signal S31. The level of the pulse signal S41 is low when the signal S32a is not larger than the AC signal S31. The pulse signal S41 is generated substantially at the timing of the falling edge of the transmission signal S1. Thus, comparator 211 outputs the signal (the pulse signal S41) corresponding to the falling edge of the transmission signal S1.

Comparator 212 has inverting input terminal 212a which receives the AC signal S32. Comparator 212 further has non-inverting input terminal 212b which receives a signal 531a which is obtained by adding an offset voltage Voff2 to the AC signal S31. The offset voltage Voff2 is generated by resistor R4 and constant current source IS2. Resistor R4 is electrically connected between transmission line 24 and non-inverting input terminal 212b of comparator 212. Constant current source IS2 is electrically connected between power-supply potential point Vdd and node P102 at which one end of resistor R4 is connected with non-inverting input terminal 212b of comparator 212.

Comparator 212 outputs the pulse signal S42. The level of pulse signal S42 is high when the signal 531a is larger than the AC signal S32. The level of pulse signal S42 is low when the signal 531a is not larger than the AC signal S32. The pulse signal S42 is generated substantially at the timing of the rising edge of the transmission signal S1. Thus, comparator 212 outputs the signal (the pulse signal S42) corresponding to the rising edge of the transmission signal S1.

As described above, in signal transmission circuit 100 according to the present embodiment, the offset voltages Voff1 and Voff2 are supplied to non-inverting input terminals 211b and 212b of comparators 211 and 212, respectively. This configuration prevents comparators 211 and 212 of signal transmission circuit 100 from causing chattering.

Signal transmission circuit 100 according to the present embodiment may preferably include a trimming circuit capable of arbitrarily adjusting the offset voltages Voff1 and Voff2. The trimming circuit can adjust the sensitivities of comparators 211 and 212 if the sensitivities changes due to component variation. The trimming circuit adjusts the value of the current supplied, for example, from constant current sources IS1 and IS2, thereby arbitrarily adjusting the offset voltages Voff1 and Voff2. Signal transmission circuit 100 may not necessarily include the trimming circuit, and the offset voltages Voff1 and Voff2 may not necessarily be supplied to comparators 211 and 212.

Voltage divider circuit 23 is configured to divide the voltage between transmission lines 24 and 25. Voltage divider circuit 23 includes a series assembly including resistors R1 and R2 connected in series with each other. A first end of resistor R1 is electrically connected to transmission line 24. A first end of resistor R2 is electrically connected to transmission line 25. Second ends of resistors R1 and R2 are connected with each other at node P103 where the intermediate voltage VC1 between the voltages of transmission lines 24 and 25 is generated. In other words, the voltage VC1 is a voltage obtained by voltage divider circuit 23.

The intermediate voltage VC1 is obtained by dividing the voltage between transmission lines 24 and 25. Resistors R1 and R2 do not necessarily have the same common resistance value; however, resistors R1 and R2 have the same resistance value so that the circuit design can be simplified. Voltage divider circuit 23 may include a series assembly including three or more resistors connected in series with one another instead of two resistors R1 and R2. Voltage divider circuit 23 may be implemented by a series assembly of plural capacitors connected in series with each other, instead of resistors. Signal transmission circuit 100 according to the present embodiment may not necessarily include voltage divider circuit 23.

Extraction circuit 22 is implemented by, for example, an RS flip-flop circuit. Extraction circuit 22 extracts the transmission signal S1 based on the pulse signals S41 and S42 and outputs the extracted signal as the output signal S5. In other words, extraction circuit 22 extracts the signal S1 based on the comparison results of the comparators (211 and 212).

The term "extract the transmission signal S1" means to extract the signal S1 such that data transmitted from primary circuit 1 to secondary circuit 2 can be taken out. In other words, the signal S1 extracted by extraction circuit 22 contain the same information as the signal S1 applied to primary circuit 1. Thus, the signal S1 extracted by extraction circuit 22 may have a different waveform, such as amplitude, or may be delayed from the transmission signal S1 applied to primary circuit 1.

The pulse signal S41 is applied to reset terminal 22b, whereas the pulse signal S42 is applied to set terminal 22a of extraction circuit 22. Extraction circuit 22 outputs the output signal S5. The level of the output signal S5 is high when set terminal 22a receives the pulse of the pulse signal S42. The level of the output signal S5 is low when reset terminal 22b receives the pulse of the pulse signal S41. As described above, the pulse signal S41 generates a pulse substantially simultaneously to the falling edge of the signal S1. The pulse signal S42 generates a pulse substantially simultaneously to the rising edge of the signal S1. As a result, the level of the output signal S5 alternates high and low substantially simultaneously to the rising edge and the falling edge of the signal S1, respectively. Extraction circuit 22 thus extracts the transmission signal S1 and output the extracted signal as the output signal S5.

Figure 6A:
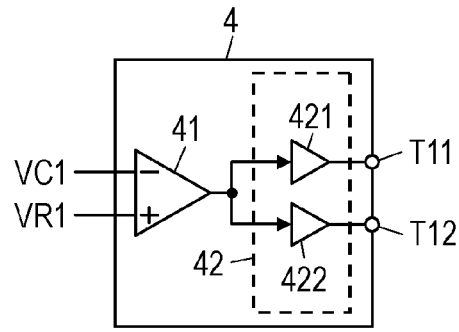
FIG. 6A is a schematic block diagram of a feedback circuit of the signal transmission circuit according to the embodiment.

FIG. 6A is a schematic block diagram of feedback circuit 4. As shown in FIG. 6A, feedback circuit 4 includes differential amplifier circuit 41 and control circuit 42. Control circuit 42 includes buffers 421 and 422 and a pair of terminals T11 and T12. As shown in FIG. 2, terminals T11 and T12 are electrically connected to nodes 26 and 27, respectively. Nodes 26 and 27 are provided on transmission lines 24 and 25, respectively. Terminals T11 and T12 maybe, for example, parts of conductors as wires on a substrate.

Figure 6B:
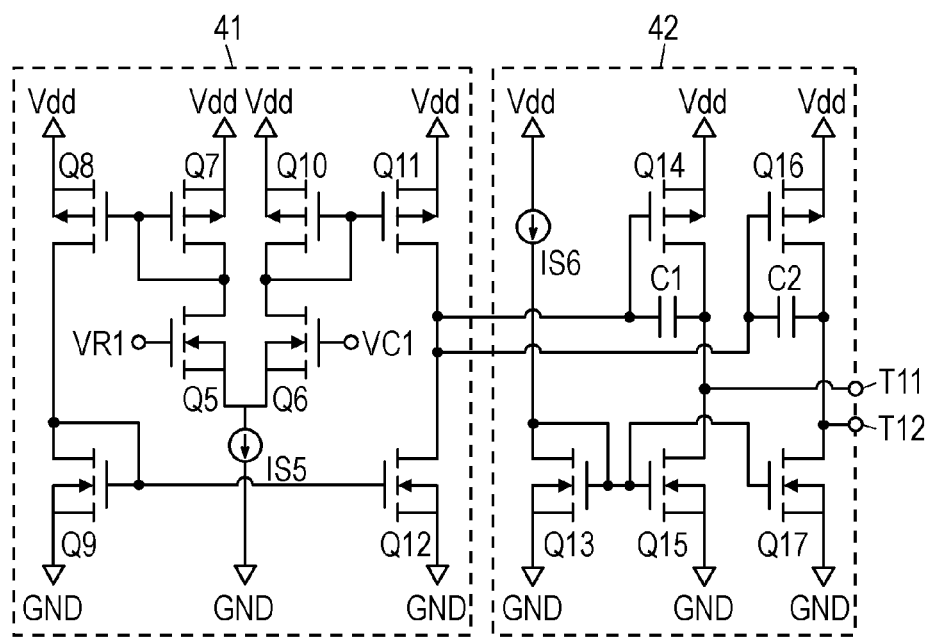
FIG. 6B is a schematic circuit diagram of a differential amplifier circuit and a control circuit of the signal transmission circuit according to the embodiment.

FIG. 6B is a schematic circuit diagram of differential amplifier circuit 41 and control circuit 42. As shown in FIG. 6B, differential amplifier circuit 41 includes eight switching elements Q5 to Q12 and constant current source IS5. Switching elements Q5, Q6, Q9, and Q12 are enhancement-mode n-channel MOSFETs, whereas switching elements Q7, Q8, Q10, and Q11 are enhancement-mode p-channel MOSFETs. The gate of switching element Q5 receives the reference voltage VR1. The voltage VR1 is generated in, for example, a band gap reference (BGR) circuit. The gate of switching element Q6 receives the intermediate voltage VC1. The sources of switching elements Q5 and Q6 are electrically connected to constant current source IS5. Constant current source IS5 supplies a constant current to the circuit ground GND.

The drain of switching element Q5 is electrically connected to the drain and gate of switching element Q7. The gate of switching element Q7 is electrically connected to the gate of switching element Q8. The drain of switching element Q8 is electrically connected to the drain and gate of switching element Q9. The sources of switching elements Q7 and Q8 are electrically connected to power-supply potential point Vdd. The source of switching element Q9 is electrically connected to the circuit ground GND. Switching elements Q5, Q7, Q8, and Q9 thus constitute a current mirror circuit.

The drain of switching element Q6 is electrically connected to the drain and gate of switching element Q10. The gate of switching element Q10 is electrically connected to the gate of switching element Q11. The drain of switching element Q11 is electrically connected to the drain of switching element Q12. The gate of switching element Q12 is electrically connected to the gate of switching element Q9. The sources of switching elements Q10 and Q11 are electrically connected to power-supply potential point Vdd. The source of switching element Q12 is electrically connected to the circuit ground GND. Switching elements Q6, Q10, Q11, and Q12 thus constitute a current mirror circuit.

Differential amplifier circuit 41 outputs, to buffers 421 and 422, a current signal increasing and decreasing according to the difference between the intermediate voltage VC1 and the reference voltage VR1. Differential amplifier circuit 41 increases the current signal when the intermediate voltage VC1 exceeds the reference voltage VR1. Differential amplifier circuit 41 decreases the current signal when the intermediate voltage VC1 is lower than the reference voltage VR1.

Buffer 421 is a current mirror circuit including three switching elements Q13 to Q15, capacitor C1, and constant current source IS6, as shown in FIG. 6B. Switching elements Q13 and Q15 are enhancement-mode n-channel MOSFETs. Switching element Q14 is an enhancement-mode p-channel MOSFET. Constant current source IS6 supplies a constant current from power-supply potential point Vdd to the drain of switching element Q13. The drain and gate of switching element Q13 are electrically connected to each other. The gate of switching element Q13 is electrically connected to the gate of switching element Q15. The drain of switching element Q15 is electrically connected to the drain of switching element Q14. The capacitor C1 is electrically connected between the gate and drain of switching element Q14. The source of switching element Q14 is electrically connected to power-supply potential point Vdd. The sources of switching elements Q13 and Q15 are electrically connected to the circuit ground GND.

Buffer 422 is a current mirror circuit including three switching element Q13, Q16, and Q17, capacitor C2, and constant current source IS6, as shown in FIG. 6B. Switching element Q16 is an enhancement-mode p-channel MOSFET. Switching element Q17 is an enhancement-mode n-channel MOSFET. Buffers 421 and 422 thus commonly share switching element Q13 and constant current source IS6. The gate of switching element Q17 is electrically connected to the gate of switching element Q13. The drain of switching element Q17 is electrically connected to the drain of switching element Q16. The capacitor C2 is electrically connected between the gate and drain of switching element Q16. The source of switching element Q16 is electrically connected to power-supply potential point Vdd. The source of switching element Q17 is electrically connected to the circuit ground GND.

Control circuit 42 controls the current flowing through nodes 26 and 27 according to the signal supplied from differential amplifier circuit 41. When the intermediate voltage VC1 exceeds the reference voltage VR1, currents flowing in the drains of switching elements Q14 and Q16 are larger than the current supplied from constant current source IS6, so that control circuit 42 supplies currents from terminals T11 and T12 to nodes 26 and 27, respectively. When the intermediate voltage VC1 is lower than the reference voltage VR1, currents flowing in the drains of switching elements Q14 and Q16 are smaller than the current supplied from constant current source IS6, so that control circuit 42 pulls currents from nodes 26 and 27 to terminals T11 and T12, respectively.

Thus, feedback circuit 4 is electrically connected to nodes 26 and 27 provided on transmission lines 24 and 25, respectively. Feedback circuit 4 feedbacks the intermediate voltage VC1 by controlling the current flowing through nodes 26 and 27 according to the difference between the intermediate voltage VC1 and the reference voltage VR1.

Nodes 26 and 27 are preferably connected directly to input ports T1 and T2 of secondary circuit 2, and are also preferably connected directly to both ends of secondary coil L2 which generates the AC signals S31 and S32. In other words, nodes 26 and 27 are preferably connected to input ports T1 and T2 (or both ends of secondary coil L2) in order to reduce wiring impedance between each of nodes 26 and 27 and respective one of input ports T1 and T2 (or both ends of secondary coil L2). In this configuration, feedback circuit 4 can feedback the intermediate voltage VC1 so as to reduce influence of the wiring impedance between transmission lines 24 and 25.

An operation of signal transmission circuit 100 according to the embodiment will be briefly described below. Primary circuit 1 generates the differential signals S21 and S22 from the transmission signal S1 and transmits the differential signals S21 and S22 to primary coil L1. Upon receiving the differential signals S21 and S22, an alternating-current (AC) current flows in primary coil L1. When the AC current flows in primary coil L1, secondary coil L2 generates AC signals S31 and S32 containing AC components of the signals S21 and S22.

In secondary circuit 2, comparator 211 compares the AC signals S31 and S32, and outputs the pulse signal S41 corresponding to the falling edge of the transmission signal S1. Comparator 212 compares the AC signals S31 and S32, and outputs the pulse signal S42 corresponding to the rising edge of the transmission signal S1. Then, extraction circuit 22 extracts the transmission signal S1 from the pulse signals S41 and S42, and outputs the extracted signal as the output signal S5.

In signal transmission circuit 100 according to the embodiment, primary circuit 1 generates the differential signals S21 and S22 from the received transmission signal S1, and transmits the differential signals S21 and S22 to secondary circuit 2 via insulation circuit 3. Then, secondary circuit 2 extracts the transmission signal S1 from the signals received from primary circuit 1, and outputs the output signal S5 corresponding to the transmission signal S1.

Parasitic capacitances Cp1 and Cp2 exist between primary coil L1 (the primary element) and secondary coil L2 (the secondary element), as shown in FIG. 2. If noise, especially common mode noise is applied to primary circuit 1 due to, for example, lightning surges, the noise may be transmitted to secondary circuit 2 via the parasitic capacitances Cp1 and Cp2.

Figure 7:
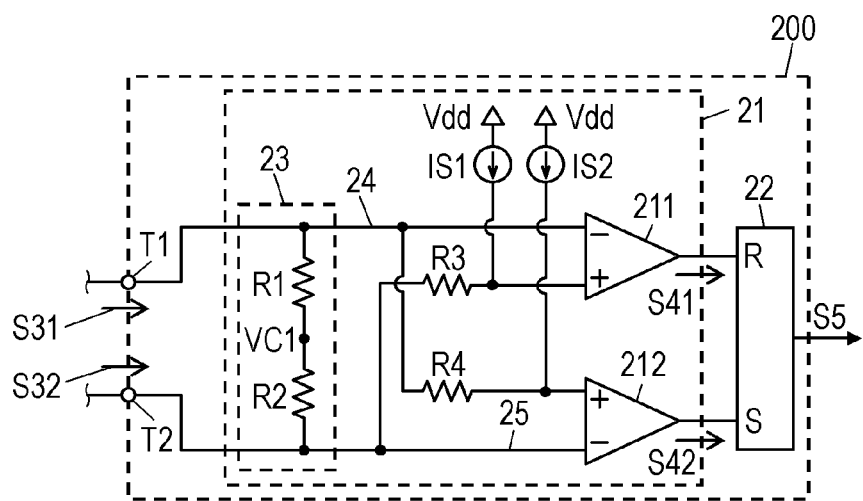
FIG. 7 is a schematic circuit diagram of a secondary circuit of a comparative example of a signal transmission circuit.
Figure 8:
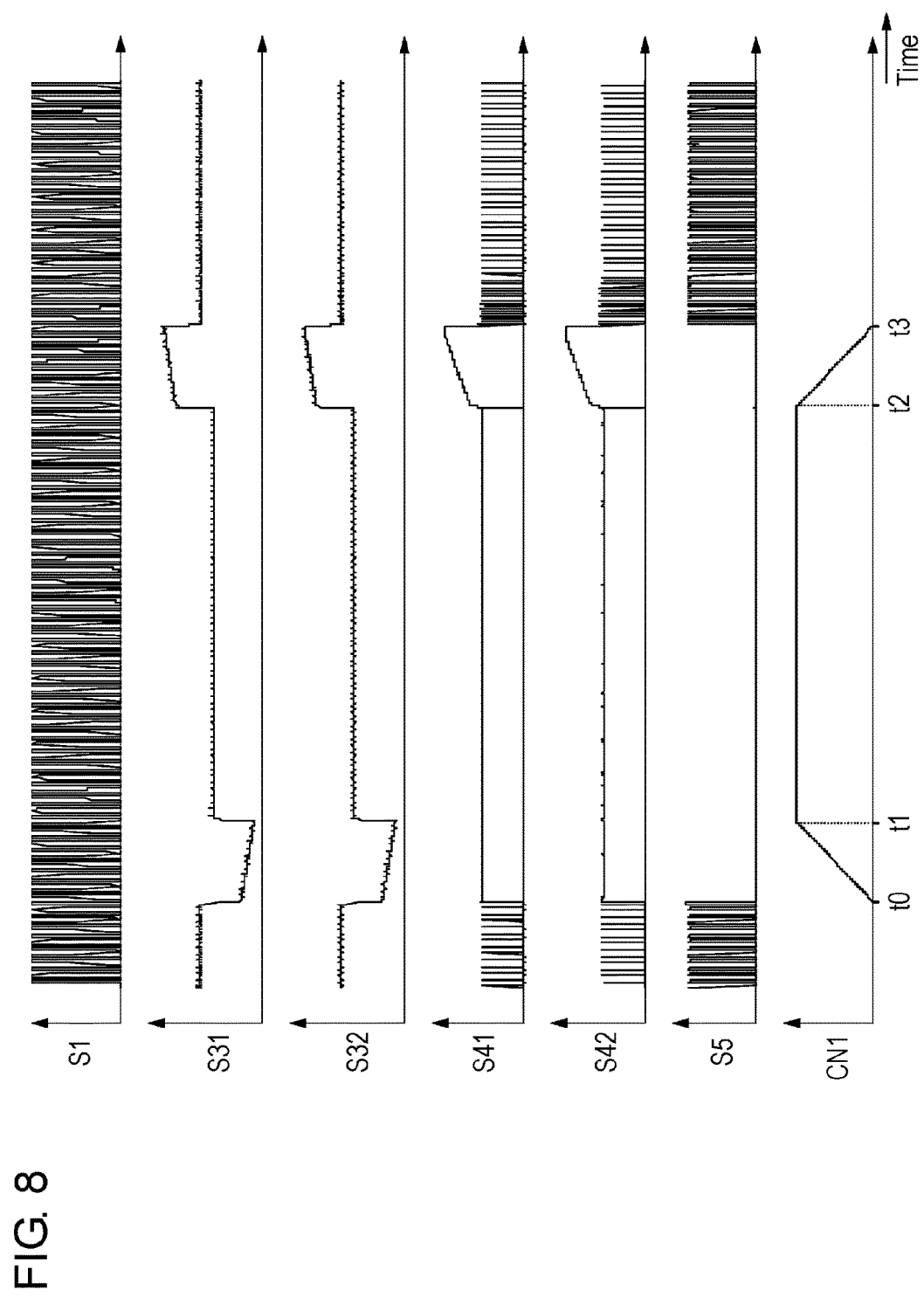
FIG. 8 shows signal waveforms obtained by a simulation of an operation of the comparative example of the signal transmission circuit.

FIG. 7 is a schematic circuit diagram of secondary circuit 200 of a comparative example of a signal transmission circuit. In FIG. 7, components identical to those of secondary circuit 2 shown in FIG. 2 are denoted by the same reference numerals. As shown in FIG. 7, the comparative example of the signal transmission circuit (secondary circuit 200) is identical to signal transmission circuit 100 (secondary circuit 2) according to the present embodiment except that secondary circuit 200 does not include feedback circuit 4. An operation of the primary circuit of the comparative example of the signal transmission circuit upon having noise applied thereto will be described below. FIG. 8 shows signal waveforms obtained by a simulation in which common mode noise is applied to the primary circuit of the comparative example of the signal transmission circuit. In FIG. 8, the vertical axis represents signal values, and the horizontal axis represents time.

In the simulation shown in FIG. 8 for the comparative example of the signal transmission circuit, several tens of kilovolts of positive-polarity voltage CN1, a simulated common mode noise, is applied to the primary circuit for a period from time point t0 to time point t3. The intermediate voltage VC1 increases for the period (e.g, 1 μs) between time points t0 and t1, whereas the voltage levels of the AC signals S31 and S32 decrease for the period. Therefore, in the example shown in FIG. 8, comparators 211 and 212 may malfunction when the voltage levels of the AC signals S31 and S32 fall outside allowable input voltage ranges of comparators 211 and 212.

Similarly, the intermediate voltage VC1 decreases for a period (e.g., 1 μs) between time points t2 and t3, whereas the voltage levels of the AC signals S31 and S32 increase for the period. Therefore, in the example shown in FIG. 8, comparators 211 and 212 may malfunction when the voltage levels of the AC signals S31 and S32 fall outside the allowable input voltage range of comparators 211 and 212. Hence, the comparative example of the signal transmission circuit may produce abnormalities in the pulse signals S41 and S42 applied to extraction circuit 22. In this case, the output signal S5 of extraction circuit 22 may not be output properly. This may cause transmission errors of the transmission signal S1.

Even in the above-described conventional signal transmission circuit, if noise is applied to the primary circuit due to, for example, lightning surges, the noise can be transmitted to the secondary circuit, possibly causing the secondary circuit to malfunction.

Figure 9:
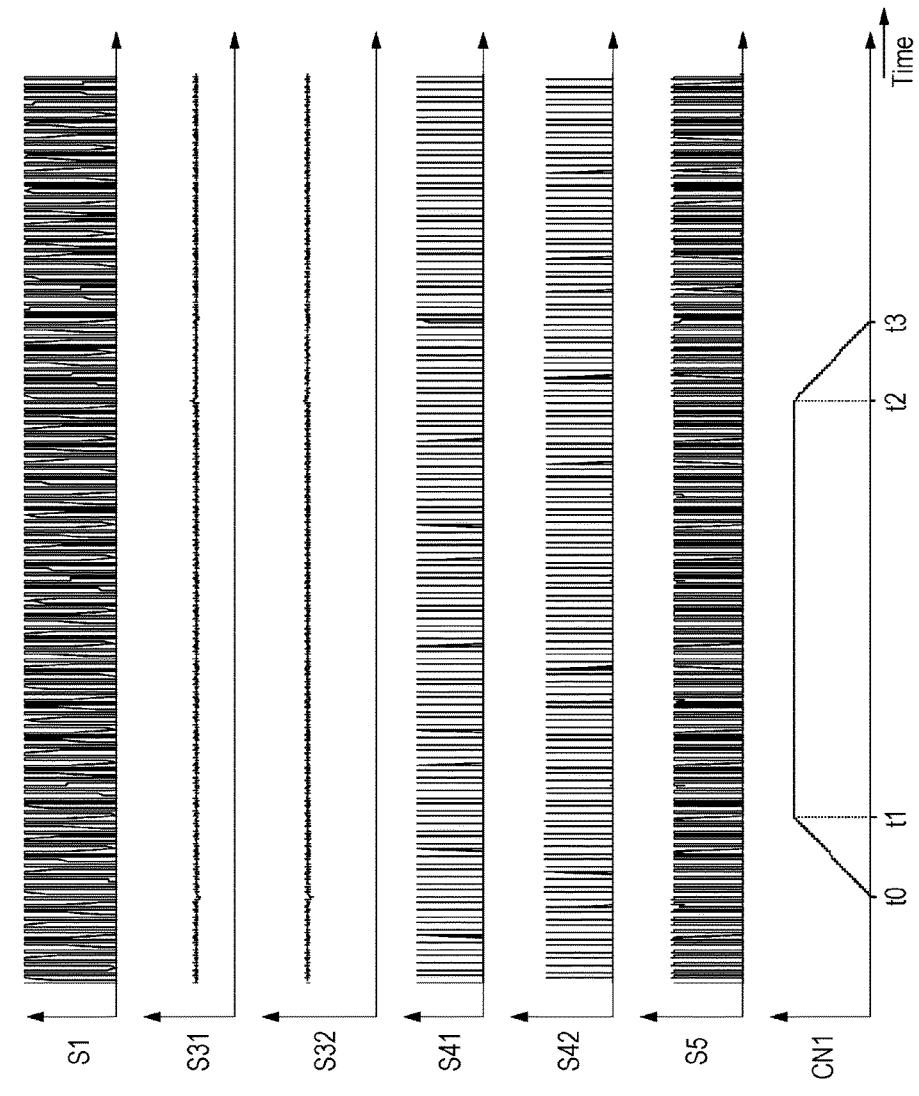
FIG. 9 shows signal waveforms indicating simulation results of the operation of the signal transmission circuit according to the embodiment.

An operation of primary circuit 1 of signal transmission circuit 100 according to the embodiment upon having noise applied thereto will be described below. FIG. 9 shows signal waveforms indicating simulation results when common mode noise is applied to primary circuit 1 of circuit 100 according to the present embodiment. In FIG. 9, the vertical axis represents signal values, and the horizontal axis represents time.

In signal transmission circuit 100 according to the present embodiment, as shown in FIG. 9, even if the positive-polarity voltage CN1, a simulated common mode noise, is applied, the intermediate voltage VC1 hardly changes since feedback circuit 4 feedbacks the intermediate voltage VC1 so as to converge the intermediate voltage VC1 to the reference voltage VR1. For the same reason, the intermediate voltage VC1 hardly changes when the negative-polarity voltage CN1 is applied. Therefore, the voltage levels of the AC signals S31 and S32 hardly change, and hardly fall outside the allowable input voltage ranges of comparators 211 and 212. As a result, comparators 211 and 212 hardly malfunction.

Thus, signal transmission circuit 100 according to the present embodiment hardly causes abnormalities in the pulse signals S41 and S42 applied to extraction circuit 22, so that extraction circuit 22 can output the output signal S5 properly. Signal transmission circuit 100 thus hardly causes transmission errors of the transmission signal S1.

As described above, in signal transmission circuit 100 according to the present embodiment, even if noise is applied to primary circuit 1 and transmitted to secondary circuit 2, feedback circuit 4 converges the intermediate voltage VC1 to the reference voltage VR1. This configuration reduces variations in the input voltage to secondary circuit 2 (particularly, the input voltage to comparators 211 and 212). For this reason, in signal transmission circuit 100, noise applied to primary circuit 1 hardly causes secondary circuit 2 to malfunction.

The malfunction of secondary circuit 2 due to the noise applied to primary circuit 1 may be reduced by insulation circuit 3 including two transformers each including primary coil L1 and secondary coil L2. However, this configuration with two transformers increases circuit size and cost.

In signal transmission circuit 100 according to the present embodiment, feedback circuit 4 allows secondary circuit 2 to be less likely to malfunction without two transformers, consequently preventing the size cost of circuitry from increasing.

In signal transmission circuit 100 according to the present embodiment, the frequency of possible noise (common mode noise) is at most several hundreds of megahertz although it depends on the frequency of occurrence of noise. On the other hand, the frequencies of the AC signals S31 and S32 supplied from secondary coil L2 (the secondary element) are higher than several hundreds of megahertz or are several gigahertz in accordance with properties of the transformer (primary coil L1 and secondary coil L2).

The AC signals S31 and S32 are differential signals, and may not be removed by feedback circuit 4 which removes in-phase components, such as common mode noise. However, considering exceptional cases, feedback circuit 4 preferably remove only common mode noise and not to affect the AC signals S31 and S32.

Figure 10:
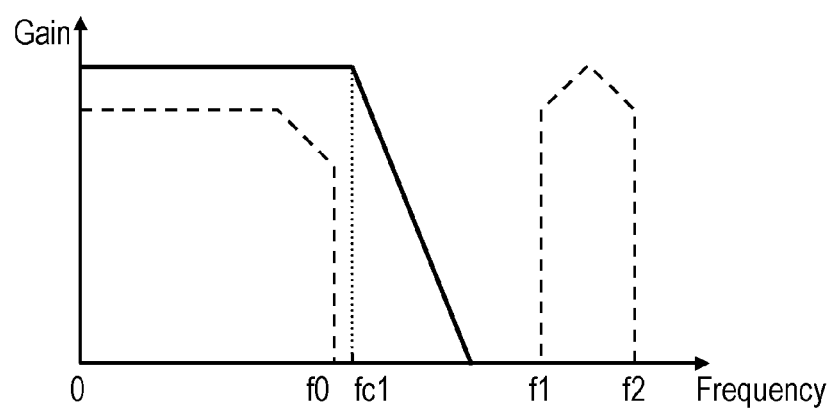
FIG. 10 shows frequency characteristics of the feedback circuit of the signal transmission circuit according to the embodiment.

For this reason, in signal transmission circuit 100 of the present embodiment, feedback circuit 4 preferably limits the propagation of the AC signals S31 and S32. FIG. 10 shows frequency characteristics of feedback circuit 4. Assuming that the common mode noise has frequencies ranging from 0 to frequency f0 (Hz), and the AC signals S31 and S32 have frequencies ranging from frequency f1 to frequency f2 (Hz), as shown in FIG. 10. In this case, feedback circuit 4 preferably has a cut-off frequency fc1 between frequencies f0 and f1, that is, satisfies the relation, f0<fc1<f1. In this configuration, feedback circuit 4 responds to the common mode noise with frequencies lower than the cut-off frequency fc1 and hardly responds to the AC signals S31 and S32 with frequencies higher than the cut-off frequency fc1.

The cut-off frequency fc1 is determined by a capacitive component and a resistance component present in feedback circuit 4. The capacitive and resistance components can be properly modified by adjusting the size of switching elements Q5 to Q17 of feedback circuit 4 or the current supplied from the constant current source IS3.

In signal transmission circuit 100 according to the present embodiment, insulation circuit 3 includes primary coil L1 (the primary element) and secondary coil L2 (the secondary element) which are magnetically coupled with each other. The primary element and the secondary element are thus magnetically coupled with each other Alternatively, the primary element and the secondary element may be coupled with each other in another effect.

Figure 11:
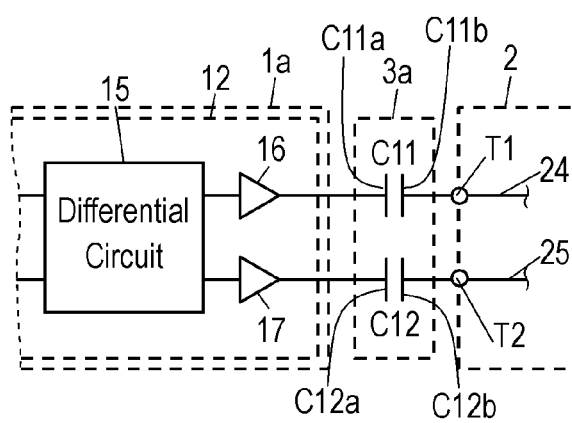
FIG. 11 is a schematic circuit diagram of another primary circuit and another insulation circuit of the signal transmission circuit according to the embodiment.

FIG. 11 is a schematic circuit diagram of primary circuit 1a and insulation circuit 3a of the signal transmission circuit according to the present embodiment. In FIG. 11, components identical to those of primary circuit 1 and insulation circuit 3 of signal transmission circuit 100 shown in FIG. 2 are denoted by the same reference numerals. Primary circuit 1a includes buffers 16 and 17 in place of driving circuit 13 of primary circuit 1 shown in FIG. 2. Each of buffers 16 and 17 has an input port connected to respective one of the output ports of differential circuit 15. Insulation circuit 3a includes capacitor C11 including opposing electrodes C11a and C11b which form the capacitance of capacitor C11. Insulation circuit 3a further includes capacitor C12 including opposing electrodes C12a and C12b which form the capacitance of capacitor C12. Electrodes C11a and C12a of capacitors C11 and C12 are electrically connected to respective output ports of buffers 16 and 17 of primary circuit 1a. Electrodes C11b and C12b of capacitors C11 and C12 are connected to input ports T1 and T2 of secondary circuit 2, respectively. In capacitors C11 and C12, electrodes C11a and C12a adjacent to primary circuit 1 function as the primary element, and electrodes C11b and C12b adjacent to secondary circuit 2 function as the secondary element. In other words, in signal transmission circuit 100 according to the present embodiment, the primary element may be capacitively coupled with the secondary element.

REFERENCE MARKS IN THE DRAWINGS 100 signal transmission circuit
1 primary circuit
13 driving circuit
15 differential circuit
2 secondary circuit
211 comparator (first comparator)
212 comparator (second comparator)
22 extraction circuit
23 voltage divider circuit
24, 25 a pair of transmission lines
26, 27 node
4 feedback circuit
S1 transmission signal
S21, S22 differential signal
L1 primary coil (primary element)
L11 end (first end)
L12 end (second end)
L2 secondary coil (secondary element)
S31, S32 AC signal
VC1 intermediate voltage
VR1 reference voltage
T1, T2 input port

The invention claimed is:

1. A signal transmission circuit comprising:
   a primary element configured to receive differential signals generated from a transmission signal, the differential signals containing alternating-current (AC) components;
   a secondary element magnetically or capacitively coupled with the primary element, the secondary element being configured to output AC signals containing the AC components of the differential signals;
   a secondary circuit connected to the secondary element, the secondary circuit including a pair of transmission lines configured to propagate the AC signals, the secondary circuit being configured to extract the transmission signal from the AC signals;
   a feedback circuit configured to feedback an intermediate voltage between voltages of the pair of transmission lines so as to converge the intermediate voltage to a reference voltage; and
   a primary circuit connected to the primary element, the primary circuit being configured to generate the differential signals from the transmission signal, wherein:
   the primary element and the secondary element comprise a primary coil and a secondary coil magnetically coupled with each other, respectively, and
   the primary circuit includes:
      a differential circuit configured to differentiate the differential signals; and
      a driving circuit configured to
         output one signal out of the differentiated differential signals to a first end of the primary coil, the one signal corresponding to a rising edge of the transmission signal, and
         output another signal out of the differentiated differential signals to a second end of the primary coil, the another signal corresponding to a falling edge of the transmission signal.

2. The signal transmission circuit according to claim 1, wherein the secondary circuit further includes a voltage divider circuit configured to divide a voltage between the pair of transmission lines so as to obtain the intermediate voltage.

3. The signal transmission circuit according to claim 1, wherein the feedback circuit is configured to limit propagation of the AC signals.

4. The signal transmission circuit according to claim 1, wherein the feedback circuit is connected to nodes each provided on respective one of the pair of transmission lines, and to feedback the intermediate voltage by controlling currents flowing through the nodes according to a difference between the intermediate voltage and the reference voltage.

5. The signal transmission circuit according to claim 4, wherein the nodes are directly connected to input ports of the secondary circuit.

6. The signal transmission circuit according to claim 1, wherein the secondary circuit further includes:
   a comparator configured to compare the AC signals propagating through the pair of transmission lines; and
   an extraction circuit configured to extract the transmission signal based on a comparison result of the comparator.

7. The signal transmission circuit according to claim 6, wherein the comparator includes:
   a first comparator connected to the pair of transmission lines, the first comparator being configured to output a signal corresponding to the falling edge of the transmission signal; and
   a second comparator configured to output a signal corresponding to the rising edge of the transmission signal.

8. A signal transmission circuit comprising:
   a primary element configured to receive differential signals generated from a transmission signal, the differential signals containing alternating-current (AC) components;
   a secondary element magnetically or capacitively coupled with the primary element, the secondary element being configured to output AC signals containing the AC components of the differential signals, the AC signals including a first AC signal and a second AC signal;

a secondary circuit connected to the secondary element, the secondary circuit including a first transmission line configured to propagate the first AC signal and a second transmission line configured to propagate the second AC signal, the secondary circuit being configured to extract the transmission signal from the AC signals;

a feedback circuit configured to receive an intermediate voltage between a first node provided on the first transmission line and a second node provided on the second transmission line, including a first output terminal connected to a third node provided on the first transmission line and a second output terminal connected to a fourth node provided on the second transmission line, and configured to converge the intermediate voltage to a reference voltage by respectively feeding back outputs of the feedback circuit to the third node and the fourth node; and a primary circuit connected to the primary element, the primary circuit being configured to generate the differential signals from the transmission signal, wherein:

the third node is provided between a first input port of the secondary circuit connected to the secondary element and the first node, and the fourth node is provided between a second input port of the secondary circuit connected to the secondary element and the second node, the primary element and the secondary element comprise a primary coil and a secondary coil magnetically coupled with each other, respectively, and the primary circuit includes:
- a differential circuit configured to differentiate the differential signals by using a differentiator comprising an RC circuit including a resistor and a capacitor; and
- a driving circuit configured to output one signal out of the differentiated differential signals to a first end of the primary coil, the one signal corresponding to a rising edge of the transmission signal, and output another signal out of the differentiated differential signals to a second end of the primary coil, the another signal corresponding to a falling edge of the transmission signal.

9. The signal transmission circuit according to claim 1, wherein the differential circuit includes a differentiator comprising an RC circuit including a resistor and a capacitor, and is configured to differentiate the differential signals by using the differentiator.

10. The signal transmission circuit according to claim 8, wherein the differential circuit includes a differentiator comprising an RC circuit including a resistor and a capacitor, and is configured to differentiate the differential signals by using the differentiator.

* * * * *